United States Patent [19]
Wu et al.

[11] Patent Number: 5,998,251
[45] Date of Patent: Dec. 7, 1999

[54] PROCESS AND STRUCTURE FOR EMBEDDED DRAM

[75] Inventors: H. J. Wu, Hsinchu; Shih-Wei Sun, Taipei; Jacob Chen, Hsinchu; Tri-Rung Yew, Hsinchu Hsien, all of Taiwan

[73] Assignee: United Microelectronics Corp., Hsinchu, Taiwan

[21] Appl. No.: 08/975,492

[22] Filed: Nov. 21, 1997

[30] Foreign Application Priority Data

Jul. 19, 1997 [TW] Taiwan ................................. 86110245

[51] Int. Cl.⁶ .............................................. H01L 21/8242
[52] U.S. Cl. ........................................... 438/241; 438/253
[58] Field of Search ........................... 438/238, 239–241, 438/253, 254, 396, 397

[56] References Cited

U.S. PATENT DOCUMENTS

| | | | |
|---|---|---|---|
| 5,399,890 | 3/1995 | Okada et al. | 257/306 |
| 5,644,151 | 7/1997 | Izumi et al. | 257/306 |
| 5,719,079 | 2/1998 | Yoo et al. | 438/238 |
| 5,879,981 | 3/1999 | Tanigawa | 438/241 |
| 5,920,775 | 7/1999 | Koh | 438/241 |

FOREIGN PATENT DOCUMENTS

| | | |
|---|---|---|
| 0 337 436 | 10/1989 | European Pat. Off. . |
| 03136361 | 6/1991 | Japan . |
| 03205866 | 9/1991 | Japan . |
| 96/26544 | 8/1996 | WIPO . |

*Primary Examiner*—Joni Chang
*Attorney, Agent, or Firm*—Rabin & Champagne, P.C.

[57] ABSTRACT

An integrated circuit device having both an array of logic circuits and an array of embedded DRAM circuits is provided using a process that avoids some of the most significant processing challenges for embedded DRAM integration. Transfer FETs and wiring lines are provided for the embedded DRAM circuits and FETs are provided for the logic portions of the device in an initial phase of the process. The gate electrodes and source/drain regions of the logic FETs are subjected to a salicide process at this initial phase and a thick planarized oxide layer is provided over both the embedded DRAM regions and the logic circuit regions. Capacitors and logic interconnects are next formed using common etching, titanium nitride deposition and tungsten deposition steps. Contact vias are formed to expose each of the source drain regions of the DRAM transfer FETs and to expose select conductors within the logic circuits. A titanium nitride layer is deposited over the device and within the various contact vias through the planarized oxide layer. A capacitor dielectric layer is provided over the device and then the capacitor dielectric layer is selectively removed from at least the contact vias that become bit line contacts and logic interconnects. A layer of tungsten is deposited and patterned to provide upper capacitor electrodes and to complete the bit line contacts and logic interconnects. This first level tungsten layer also can provide bit line wiring. The ½ $V_{cc}$ potential for the upper capacitor electrodes can be provided to the circuit using a level of interconnect wiring also used by the logic circuits.

44 Claims, 8 Drawing Sheets

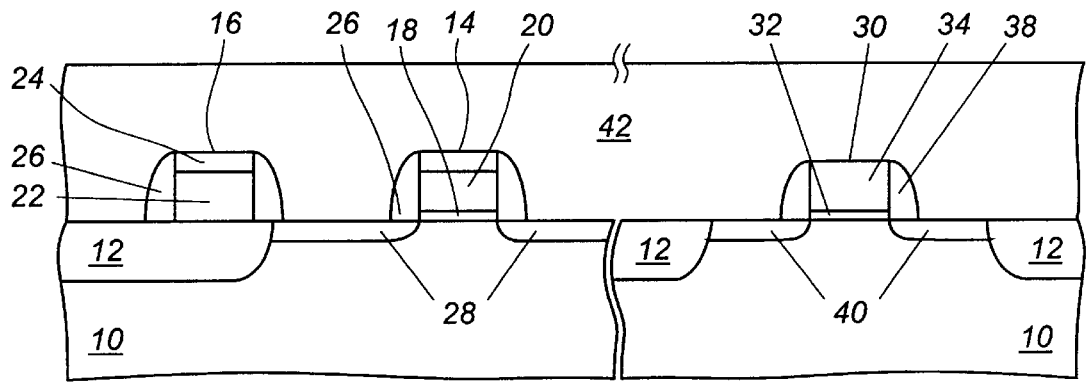
FIG. 1 -- Prior Art
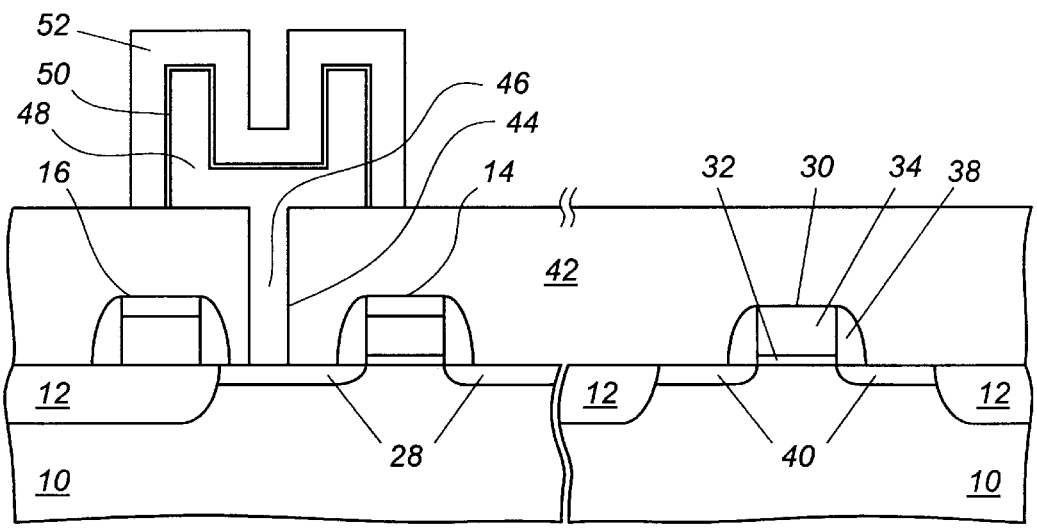
FIG. 2 -- Prior Art

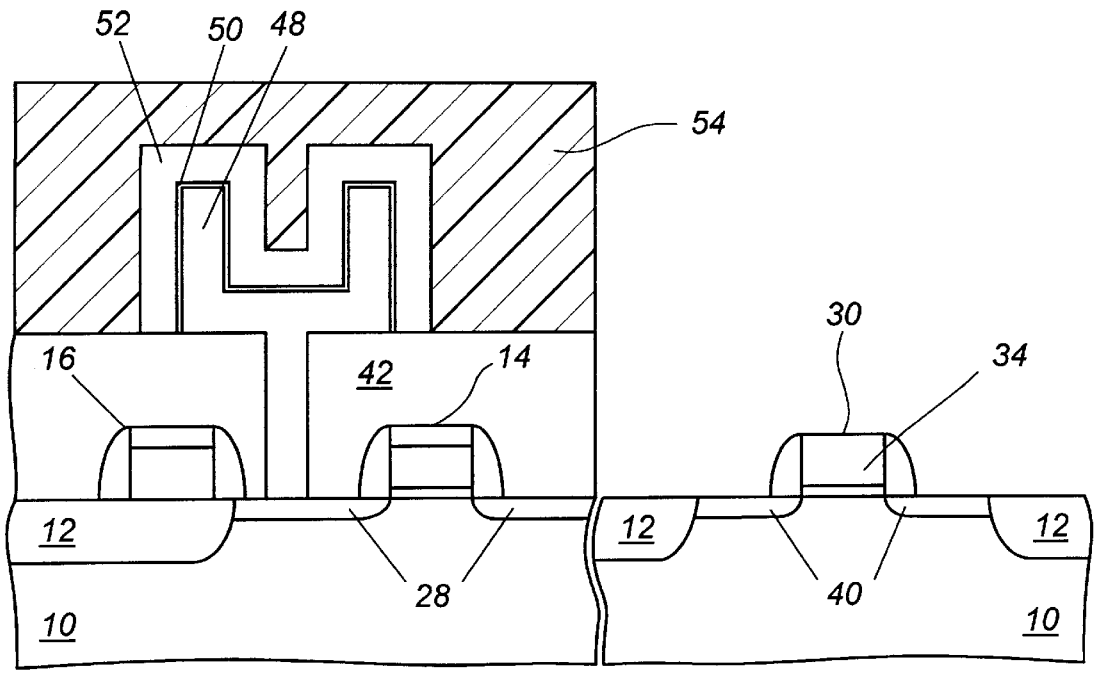
FIG. 3 -- Prior Art
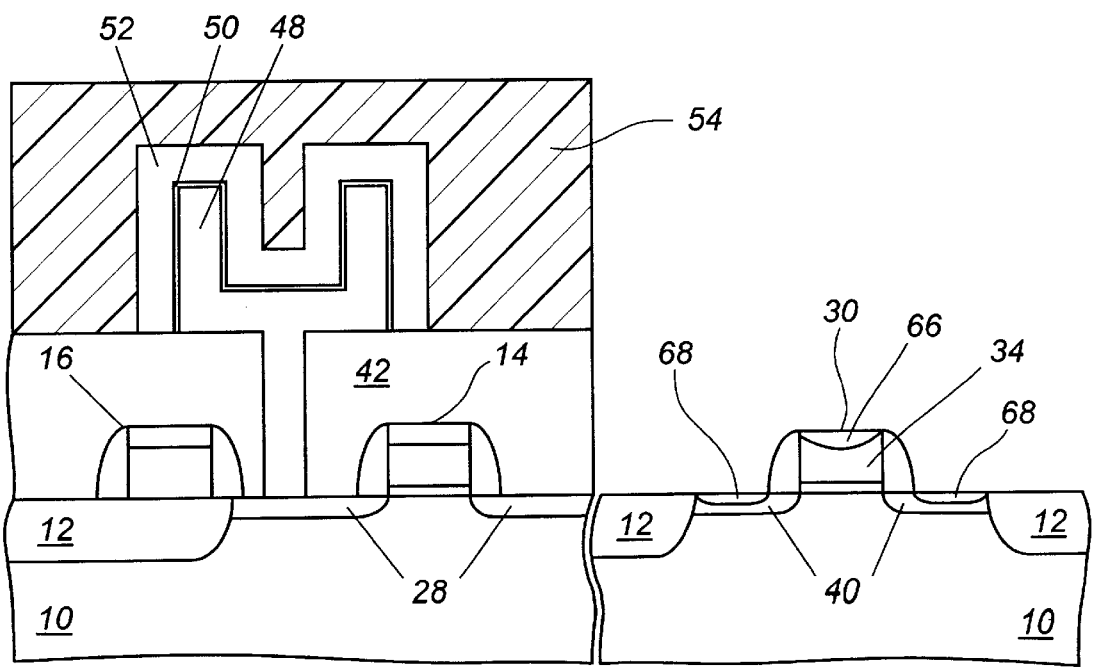
FIG. 4 -- Prior Art

PROCESS AND STRUCTURE FOR EMBEDDED DRAM

BACKGROUND OF THE INVENTION

1. Field of the Invention

Aspects of the present invention relate to the formation of integrated circuit devices that incorporate both an array of memory cells and an array of logic circuits on a single chip or substrate in a process flow sharing processing steps in common between the formation of the memory array and the logic array. Other aspects of the invention relate to an integrated circuit incorporating embedded memory dedicated to logic circuits formed on the chip with the memory.

2. Description of the Related Art

For some data processing applications, it has become desirable to provide integrated circuit devices that incorporate on the same chip both arrays of memory cells and arrays of high speed logic circuits like those typically used in microprocessors or digital signal processors. It might, for example, be desirable to provide an array of dynamic random access memory cells within the integrated circuit device to provide dedicated, comparatively high speed access to a significant amount of data storage for the logic circuits of the integrated circuit device. Applications that could benefit from the provision of such embedded DRAM include logic circuits that process large amounts of data, such as graphics processors. Use of embedded memory might also reduce the number of pins or input/output terminals required by the integrated circuit device. Providing both high speed logic circuits and embedded DRAM on the same chip requires that certain aspects of the process flow used for making the chip be dedicated to the formation of logic circuits and that other aspects be dedicated to the formation of memory cells. FIGS. 1–4 illustrate a portion of a process flow that might be used to provide embedded DRAM on an integrated circuit device that includes high speed logic circuits.

FIG. 1 illustrates at an intermediate processing stage an integrated circuit device that will include embedded DRAM and an array of logic circuits. On the left side of the illustrated device is an exemplary DRAM cell and on the right side of the illustrated device is an exemplary logic FET that makes up part of a logic circuit. Other circuitry for performing input/output (I/O) functions for the integrated circuit device would typically be included, but is not shown here. The embedded DRAM cell, when complete, will include a transfer or pass field effect transistor (FET) coupled to a charge storage capacitor. The transfer FET acts as a switch for selectively coupling the lower electrode of the charge storage capacitor to a bit line so that charges, representative of data, can either be read from or stored to the charge storage capacitor. The embedded DRAM and logic circuits of the integrated circuit device are formed on a single silicon substrate 10, which typically has at least a surface layer of P-type material. Device isolation regions 12 are provided as necessary across the surface of the device. The illustrated device isolation regions 12 may be field oxide regions formed in a modified local oxidation of silicon (LOCOS) process or may be shallow trench isolation (STI) devices consisting of trenches filled with oxide by chemical vapor deposition (CVD). The illustrated cross section of the embedded DRAM cell includes a section through a transfer FET 14 and through an adjacent wiring line structure 16. The wiring line structure 16 is typically an extension of the gate electrode structures for adjacent DRAM cells and so has an almost identical structure to the illustrated gate electrode structure. The gate electrode structure includes a gate electrode 20 including at least a lower layer of doped polysilicon provided on gate oxide layer 18. Most typically, the wiring line conductor 22 also includes at least a lower layer of doped polysilicon formed on the field oxide isolation region 12. A capping oxide layer 24 is provided early in processing to protect the gate electrode 20 and wiring line conductor 22. Oxide spacer structures 26 are provided on either side of the gate electrode and wiring lines, typically by CVD silicon oxide deposition followed by an etch back process. Oxide spacer structures 26 provide lateral protection to the gate electrode and wiring line during processing and might also be used in the formation of lightly doped drain (LDD) structures for the source and drain regions of the transfer FETs. Source/drain regions 28 are formed by self-aligned ion implantation of N-type dopants on either side of the gate electrode 20 to complete the transfer FET 14.

Portions of the logic circuitry, schematically illustrated on the right of FIGS. 1–4, are formed nearly contemporaneously with the formation of the transfer FETs of the DRAM array. Depending on design choices, some processing steps may be shared between the embedded DRAM and logic formation processes or wholly distinct processes might be used for forming the DRAM and logic circuits. The exemplary FET 30 of the logic circuit is formed on a gate oxide layer 32 and includes a polysilicon gate electrode 34. It is generally preferred to not provide a silicide layer over the polysilicon gate electrode layer 34 at the illustrated stage of the manufacturing process. Instead, self-aligned silicide ("salicide") process is used to complete the FETs of the logic circuit at a later stage in the manufacturing process. Oxide spacers 38 are formed on either side of the gate electrode 34 and are typically used in defining an LDD structure for the source/drain regions 40 of the logic FETs.

After formation of the FETs for the DRAM array and the logic array, it is typical to provide a thick oxide layer 42 over the entire substrate 10. The oxide layer is deposited to a sufficient thickness to both cover the various device structures and to provide a sufficient thickness for the planarization of the oxide layer 42. Planarization of the oxide layer 42 is important to improve the process latitude for the photolithography and etching steps used to form the lower electrode of the charge storage capacitor. After provision of the planarized oxide layer, a via 44 is formed through the planarized oxide layer to expose the source/drain region 28 to which the charge storage capacitor of the illustrated DRAM cell will be connected. Doped polysilicon is provided within via 44 to form a vertical interconnect 46 between the source/drain region 28 and the lower electrode 48 of the charge storage capacitor. The lower electrode 48 of the charge storage capacitor is typically formed from several layers of doped polysilicon. For the design rules typically used in modern processes, it is important to provide a three dimensional crown or fin capacitor structure for the lower electrode 48 so that it has sufficient surface area to provide a sufficient level of charge storage for the capacitor. Such a crown or fin structure is necessary to ensure that the charge storage capacitor of the DRAM cell stores a sufficiently large charge to facilitate data reading and writing operations as well as to ensure that the stored charge remains on the charge storage capacitor for an acceptable amount of time without requiring a refresh operation. Formation of the charge storage capacitor continues by providing a capacitor dielectric 50 consisting of the three layer oxide/nitride/oxide structure known as ONO over the lower capacitor electrode 48. An upper electrode 52 is formed by providing another layer of doped polysilicon which is patterned in a manner conventional to DRAM arrays. The completed charge storage capacitor is shown in FIG. 2.

After completion of the charge storage capacitor, a mask such as photoresist mask 54 is provided over the FIG. 2 device to cover the embedded DRAM array and to expose the oxide layer 42 over the array of logic circuitry. Etching is performed to remove the thick oxide layer 42 from above the logic circuitry, resulting in the structure shown in FIG. 3. Processing continues on the logic FET 30 to form a silicide layer 66 over the gate electrode 34 and silicide layers 68 over the source/drain regions 40, as shown in FIG. 4. The silicide layers 66, 68 reduce the resistivity and contact resistance of the gate electrode and the source/drain regions. Typically, the silicide layers are formed in a self-aligned silicide ("salicide") process in which a layer of a refractory metal such as titanium is deposited over the exposed polysilicon gate electrode and the exposed silicon source/drain regions. An initial anneal is performed to convert a portion of the deposited metal layer to a metal silicide. An etch is performed to remove unreacted metal and then a second anneal is performed to achieve a low resistivity for the metal silicide layers 66, 68 on the gate electrode 34 and source/drain regions 40. Processing continues to provide a typically multi-layer interconnect structure dedicated to the logic circuitry (not shown). Further processing completes the integrated circuit device which includes both logic circuitry and embedded DRAM circuitry.

To date, providing embedded DRAM for the logic circuits of an integrated circuit device to enhance the performance of the logic circuits and the device as a whole has been an expensive process which exhibits undesirably low yields for the desired integrated circuit device. It is accordingly desirable to provide a better process for forming embedded DRAM integrated circuit devices.

SUMMARY OF THE PREFERRED EMBODIMENTS

Embodiments of the present invention provide a method of making an integrated circuit device including both embedded DRAM circuits and logic circuits on a single substrate. The method includes the steps of providing a substrate, providing transfer FETs in and on embedded DRAM circuit regions of the substrate and providing logic FETs in and on logic circuit regions of the substrate. A first insulating layer is provided over the transfer FETs and over the logic FETs. First and second openings are defined through the first insulating layer to expose the first and second source/drain regions, respectively, of at least one of the transfer FETs and a third opening is defined to expose at least one conductor within the logic circuit. A first conductive layer is provided over the first insulating layer, extending into the openings to contact the first source/drain region of the one transfer FET so that the first conductive layer lines and does not fill the first opening. A capacitor dielectric layer is provided within the first opening. A second conductive layer is provided within the first opening and the first conductive layer and the second conductive layer are patterned to laterally define a lower and an upper capacitor electrode, respectively, of an embedded DRAM charge storage capacitor.

A particular aspect of the invention forms the embedded DRAM charge storage capacitor without use of high temperature processing steps.

Some embodiments of the invention include the steps of selectively covering the transfer FETs with a protective dielectric layer while leaving the logic FETs exposed, depositing a metal layer over the logic FETs, annealing the metal layer to react the metal layer with portions of the logic FETs; removing portions of the metal layer after the step of annealing the metal layer, and then forming the first insulating layer.

A different, more detailed aspect of the invention removes the capacitor dielectric layer from within the second opening and the third opening to allow those openings to be used for forming bit line contacts and logic contacts, respectively. Further to this aspect of the invention, the second conductive layer is provided within the second opening and the third opening so that the second conductive layer is in contact with the first conductive layer within the second opening and within the third opening. From a different perspective, embodiments of the invention may provide the first conductive layer within the third opening so that the first conductive layer is in contact with the at least one conductor within the third opening.

In a still further aspect of this most recent feature, the method may deposit a second insulating layer over the second conductive layer and may provide a fourth opening through the second insulating layer to expose the upper capacitor electrode and a fifth opening through the second insulating layer to expose a portion of the second conductive layer connected to the at least one conductor. Contacts are formed by depositing a third conductive layer within the fourth and fifth openings and over the second insulating layer and then patterning the third conductive layer to form a wiring line connecting the upper capacitor electrode to a reference potential through the fourth opening and to form a logic wiring line connected to the at least one conductor.

In a different aspect of the present invention, the first conductive layer is patterned before the capacitor dielectric layer is provided and the edges of the lower capacitor electrode are covered by the capacitor electric layer. In this aspect, the edges of the upper capacitor electrode extend laterally beyond the edges of the lower capacitor electrode.

BRIEF DESCRIPTION OF THE DRAWINGS

FIGS. 1–4 illustrate steps in a conventional process for forming an embedded DRAM integrated circuit device.

DETAILED DESCRIPTION OF THE PREFERRED EMBODIMENTS

Figure 5:
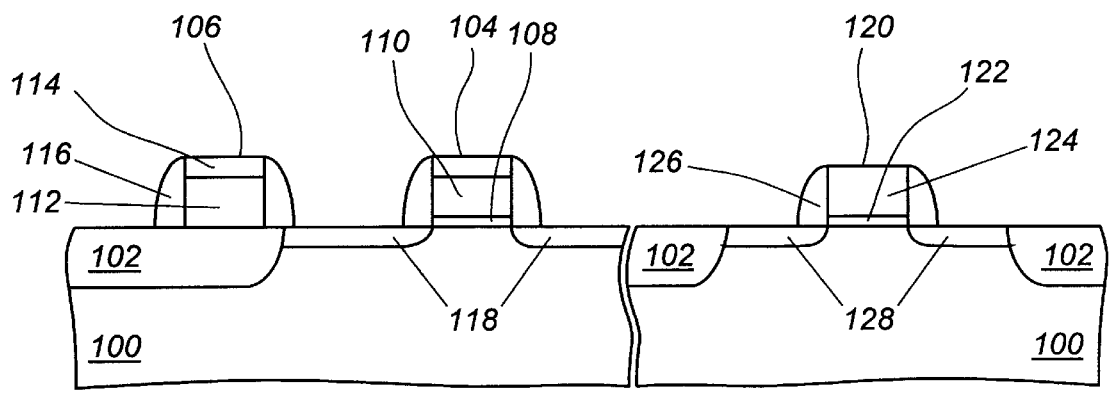
FIGS. 5–15 illustrate steps in a preferred process for forming an integrated circuit device in accordance with preferred embodiments of the present invention.

There are a variety of constraints on the conventional process illustrated in FIGS. 1–4 for providing embedded DRAM and logic circuits within an integrated circuit formed on a single chip. The process used to uncover the FETs of the logic circuitry after formation of the DRAM capacitor, that is, the process which removes oxide layer 42 and converts the FIG. 2 structure into the FIG. 3 structure, is a particular source of problems. Oxide layer 42 is made thick to achieve the desired level of planarization and to sufficiently protect the various memory and logic circuits during the etching steps used to form the crown or fin structure of the lower electrode 48 of the charge storage capacitor. Because the oxide layer 42 tends to be thick, removal of the oxide layer 42 from above the logic circuits requires a prolonged etching process. The polysilicon gate electrode 34 extends above the source/drain regions 40 of the substrate by about 2000 Å and, quite possibly, by as much as 4000–5000 Å. Etching to remove the oxide layer 42 therefore must continue through one thickness of oxide over the gate electrode of the logic FET and a greater thickness of oxide over the source/drain regions. The etching process must be continued until the source/drain regions 40 are exposed, so that the effect of removing the oxide layer 42 is to expose the gate electrode to the etching process for undesirable period of time while etching continues to expose the source/drain regions 40. Thus, the etching process inevitably leads to loss of polysilicon from the gate electrode and damage to the gate electrode and gate oxide from the plasma etching process. Polysilicon loss and gate electrode processing damage has been observed to reduce the performance and yields of logic circuits in embedded DRAM integrated circuit devices.

One alternative to the lengthy etching process used to expose the source/drain regions of the logic FETs of the logic circuits shown in FIG. 3 is to complete formation of the logic FETs before forming the charge storage capacitors of the embedded DRAM array. For example, the FETs of the logic circuit might be completed before the thick oxide layer 42 is provided over the FIG. 1 structure, thereby eliminating the need to perform a blanket etch to expose the gate and source/drain regions of the logic FETs at the same time. This strategy has previously proven unworkable, however. Completion of the logic FETs of the logic circuit requires that the silicide layers 66, 68 be provided on the gate electrode 34 and source/drain regions 40, respectively. The metals provided in these silicide layers 66, 68 typically diffuse rapidly through silicon during high temperature processing steps. Such high temperature processing steps are required in the formation of the DRAM charge storage capacitors because aspects of the nitride deposition process and the subsequent oxidation process used in forming the ONO capacitor dielectric require that the device be heated to temperatures in excess of 700° C. Such high temperature processes can create a wide array of problems for the silicide layers 66, 68 and may render inoperative the FETs 30 of the logic circuit.

Particularly preferred embodiments of the present invention address these and other problems by forming the logic circuitry of embedded DRAM circuits, including salicide processing, before the charge storage capacitors of the DRAM array are completed. After the salicide process for the logic FETs is finished, the charge storage capacitors of the embedded DRAM array are formed using appropriate low temperature processing steps. By forming the charge storage capacitors after the transistors of the logic circuitry are completed, there is typically no need to etch through a thick oxide layer to expose the gate electrodes of the logic FETs for further processing. There will consequently be a reduced likelihood of damaging the gate electrodes of the logic FETs during processing. Preferred embodiments of the present invention address the conventional problems with forming charge storage capacitors after the completion of salicided logic FETs by limiting high temperature processing steps subsequent to the salicide process. The primary difficulty with forming DRAM charge storage capacitors subsequent to performing salicide processing of the logic FETs is the high speed at which titanium and other metals used in salicide processes diffuse through the silicon substrate at the temperatures conventionally used for capacitor formation. This rapid diffusion can produce the "spiking" phenomena which has been observed to be a major source of leakage from source/drain regions and can render affected FETs unusable. Spiking and other rapid diffusion phenomena can be avoided if high temperature processing steps are avoided after salicide processing steps.

In the present context, the term high temperature processing step means a processing step performed at a temperature sufficiently high to allow significant levels of transport through the silicon substrate of the metal or other materials used in the salicide process to reduce the conductivity of the gate electrodes or the source/drain regions of the logic FETs. For example, when titanium is the metal used in the salicide process, a high temperature processing step is one in which titanium readily diffuses through silicon. Typically, that will mean that a processing step performed at a temperature in excess of approximately 700° C. will be considered to be a high temperature processing step when titanium is the metal of concern. Those of skill in the art will appreciate that the temperature at which metals begin rapidly diffusing is a familiar processing parameter in the two stage annealing processes conventionally used in salicide formation. In the first stage of such a two stage salicide process, it is necessary to maintain the device below a critical temperature to avoid bridging phenomena. In a similar manner, this discussion identifies a high temperature processing step as one of sufficient temperature and duration to cause metal diffusion or spiking to occur to a sufficient extent to introduce leakage from the charge storage node. Also like the salicide process, the definition of what is a high temperature processing step will vary for the particular metals used in the salicide process and the particular geometry of the logic FETs.

High temperature processing steps are avoided in the formation of the charge storage capacitors by selecting appropriate constituent materials for the capacitor electrodes and dielectric layer and by selecting appropriate processing steps for depositing and shaping those materials. In a particularly preferred embodiment of the present invention, the charge storage capacitors of the embedded DRAM array have metallic electrodes deposited in low temperature processes and use a high dielectric constant material, also provided in a low temperature process, as the capacitor dielectric. For example, the lower electrode of the charge storage capacitor might be formed from titanium nitride, the capacitor dielectric might be tantalum pentoxide and the upper capacitor electrode might be tungsten. Each of these materials can be deposited in a chemical vapor deposition (CVD) process at an appropriately low temperature so as to not interfere with the quality of the salicided surfaces of the logic FETs.

Sufficient capacitance is provided for the DRAM charge storage capacitor both by using a high dielectric constant material as the capacitor dielectric and by providing additional charge storage surface area through the physical shape of the lower capacitor electrode. The lower capacitor electrode is preferably formed by providing a planarized dielectric layer over the transfer FET of the embedded DRAM cell, forming a contact via to expose one of the source/drain regions of the FET, and conformally depositing a layer of a conductor such as titanium nitride to line the contact via. Preferably, the thickness of the deposited layer is substantially thinner than the radius of the contact via so that the layer of conductor does not fill in the contact via. This process forms a lower capacitor electrode with a cylindrical cup shape that provides sufficient surface area to allow the capacitor to have an adequate capacitance without the additional process complexity required to provide a fin or crown capacitor electrode structure. A particularly preferred aspect of the present invention is that the upper capacitor electrode is formed as part of a tungsten plug formation process that is also used in forming contacts and interconnects for the logic circuits. This combines processes necessary to both the DRAM and logic circuits in a very natural manner that simplifies the overall process flow, improves yields and reduces costs. These processes are not conventionally combined because capacitor electrodes are typically polysilicon and even highly doped polysilicon is too resistive to be used as interconnect plug or interconnect wiring lines for the high speed logic circuits.

Most preferably, the charge storage capacitors of the embedded DRAM array have a lower electrode of titanium nitride and an upper capacitor electrode of tungsten. Tungsten plug interconnects are provided both for the bit line contacts of the embedded DRAM array and the source/drain and gate contacts of the logic circuitry. Most preferably, titanium nitride is used as the barrier or adhesion layer for the tungsten plug formation process so that the tungsten plugs will have a titanium nitride layer lining the interconnect via and a tungsten plug filling the rest of the via. Thus, the capacitor structure differs from the bit line contacts and other tungsten plug interconnects found in the logic circuitry in that the capacitor has a dielectric layer between the titanium nitride layer which forms the lower capacitor electrode and the tungsten plug which forms the upper capacitor electrode. The similarities between the capacitor and interconnect structures allows the greater use of common processing steps in the formation of the DRAM array and the logic circuitry.

Other, more specific aspects of the present invention are believed to also present advantages for the manufacture of logic circuits including embedded DRAM or other types of embedded memory. For example, because the upper capacitor electrode includes a metal formed concurrently with portions of the logic circuit's interconnect structure, the ½ $V_{cc}$ reference potential for the upper capacitor electrode can be supplied to an array of upper capacitor electrodes using a level of metal wiring lines already made necessary by the interconnect structure required by the logic circuitry. This use of common wiring line layers further reduces the number of additional processing steps required to provide embedded DRAM to a logic circuit, which is an important factor in making embedded DRAM logic circuits manufacturable and economical. In another specific aspect of the present invention, the titanium nitride layer or similar layer of conductive material that forms the lower capacitor electrode extends onto the planarized surface of the interlayer dielectric which covers the transfer FET and charge storage node. The surface and edges of the lower capacitor electrode are covered by a layer of capacitor dielectric and then the tungsten upper electrode is formed so that the edges of the upper electrode extend beyond the edges of the lower electrode. By enclosing the edges of the lower electrode in this manner, there is a reduction in the sidewall leakage for the capacitor. These and other aspects of the present invention are now described in greater detail with reference to FIGS. 5–16.

Aspects of the present invention are described with reference to a particular example of a processing circuit incorporating on a single chip embedded DRAM, high speed logic circuitry and, as required, I/O circuitry capable of operating at higher voltages than the logic circuitry. Such higher operating voltage I/O circuits are desirable when the logic circuits of the integrated circuit device operate at a reduced internal operating voltage but the integrated circuit device as a whole must interface with outside circuits that operate at higher voltages or which must be driven with higher currents than are typical of the logic circuits. The formation of the I/O circuits that might be provided for the illustrated integrated circuit device is not shown since, within the context of explaining the present invention, the formation of the I/O circuits will generally be similar to the methods used in manufacturing the illustrated logic circuits. Various stages in the formation of a cell of an embedded DRAM array are illustrated on the left side of FIGS. 5–16 and various stages in the formation of a logic FET representative of a high speed logic circuit are illustrated on the right side of FIGS. 5–16. In the illustrated embodiments, the embedded DRAM and logic circuits are formed on the P-type surface of a substrate 100 that is provided with shallow trench isolation structures 102. Shallow trench isolation structures 102 are formed around the devices of both the embedded DRAM circuits and the logic circuits by etching trenches into substrate 100 and then refilling the trenches using chemical vapor deposited (CVD) oxide. A variety of implantations including, for example, field implantations, antipunchthrough implantations and implantations to form P-well and N-well regions for NMOS, PMOS and CMOS circuitry within the logic and I/O circuits are also performed in the initial stages of the manufacture of the illustrated device.

After the various preparatory processing steps, the gate oxide layers and gate electrodes of the FETs of the various DRAM, logic and I/O circuits are provided. It is possible that the processing steps used in the formation of the FETs in these various circuits could be different to provide the different operational characteristics that may be preferred for each of these circuits. It might, for example, be desirable to provide the different FETs with different operating voltages, switching characteristics and different leakage characteristics. The FETs of the logic circuits might be designed to feature high speed and low power operation, which might require low operating voltages of about 1.8–2.5 V and a gate oxide thickness of about 40 Å. The I/O circuits might feature higher operating voltages such as about 3.3 V and larger drive currents, both of which might be facilitated by providing an intermediate gate oxide thickness such as about 75 Å. Finally, the transfer FETs of the array of embedded DRAM cells might be designed to have a low level of leakage and so might be formed to have a gate oxide layer of approximately 100 Å or more in thickness. Provision of these different thicknesses of gate oxides can be accomplished by various conventional processes that cause the substrate in the different portions of the device to be exposed to a thermal oxidation environment for different amounts of time. As gate oxide layers are formed in the different sections of the integrated circuit device, it is preferred that the gate oxide layers be protected by depositing polysilicon on the newly formed gate oxide layers. Preferably, this initial, protective layer of polysilicon is incorporated into the gate electrodes for the transfer FETs in the embedded DRAM sections and the logic FETs in the logic circuit sections of the integrated circuit device.

The transfer FET 104 and wiring line 106 of the embedded DRAM cell shown on the left of FIG. 5 are formed starting with the blanket deposition of a polysilicon layer to a thickness of between about 1500–3500 Å over the gate oxide layer 108. The polysilicon layer is doped N-type by phosphorus ion implantation and annealing. In some instances, it may be desirable to provide a layer of a metal silicide, such as titanium silicide, over the surface of the polysilicon layer that is to be patterned into the gate electrodes of the embedded DRAM transfer FETs to further reduce the resistivity of the gate electrodes and wiring lines. Because salicide processing would introduce leakage to the transfer FETs, the silicide layer is provided by sputter deposition or CVD deposition and no silicide is provided on the source/drain regions of the transfer FETs. Depending upon the nature of the later thermal processing steps, it may in fact be preferred to not provide a silicide layer on the gate electrodes to limit the diffusion of metals through the gate electrodes. For simplicity, this titanium silicide layer is not shown in the drawings. A layer of protective oxide is provided over the polysilicon layer to a thickness of, for example, 500–3000 Å. The oxide capping layer protects the gate electrodes and wiring lines of the embedded DRAM array from processing damage in subsequent etching and implantation steps. Patterning is performed on the multilayer structure to provide polysilicon lines 110, 112 for the transfer FETs 104 and wiring lines 106. The polysilicon lines 110, 112 are covered by oxide protective layers 114. Source/drain regions 118 are typically provided on either side of the gate electrodes 110 to complete the transfer FETs 104. In preferred embedded DRAM embodiments, the source/drain regions 118 are provided with a uniform and moderate level of N-type doping by implantation self-aligned to the gate electrode 110. Typically, the higher levels of doping associated with the use of lightly doped drain (LDD) structures are avoided because the associated implantation damage to the substrate can produce leakage. Oxide spacer structures 116 are formed on either side of the gate electrodes 110 and wiring lines 112 to provide further protection for the gate electrodes and wiring lines during subsequent processing and to provide a portion of the insulation between the lower capacitor electrodes and the gate electrodes and wiring lines.

Generally, the logic FETs 120 are formed at about the same time as the transfer FETs 104 of the embedded DRAM array. Depending on the differences introduced between the various FETs, such as different threshold adjust implantations, different gate electrode doping levels, and different source/drain doping levels and profiles, some of the processing steps used to form the logic FETs might be shared with the process of forming the transfer FETs of the embedded DRAM array or the I/0 circuits. Regardless of the particular process flow selected, logic FETs 120 are formed in and on the active device regions of the substrate by first forming an appropriate gate oxide layer 122. Polysilicon is deposited, doped and patterned to form gate electrodes 124. Preferably, no silicide layer is provided over the polysilicon gate electrode at this stage of processing because a silicide layer is more advantageously provided on the gate electrode through a later salicide process. Oxide spacer structures 126 are formed alongside the polysilicon gate electrode 124 both to protect the gate electrode during further processing and to facilitate the formation of LDD source/drain regions 128. It is typically preferable to form the source/drain regions 128 of the logic FETs 120 using the LDD structure to address the hot electron problem of small FETs. As such, source/drain regions 128 are formed by first implanting a comparatively light dosage of N-type ions self-aligned to the gate electrode 124 prior to formation of the oxide spacer structures 126. The oxide spacer structures 126 are then provided by blanket depositing a CVD oxide layer to a thickness of approximately 1000–2000 Å and etching back the blanket oxide layer to form the spacer structures 126. A second implantation is then made self-aligned to the spacer structures to complete the implantation of the source/drain regions 128. Subsequent annealing activates the dopants in the source/drain regions 128. It is, of course, likely that the actual logic circuits to be formed will be far more complex than the illustrated individual FET. For example, many present logic circuits include both NMOS and PMOS devices in various configurations. However, the illustrated single logic FET is an adequate illustration of the process of the present invention and so the additional complexity of typical logic circuits will not be discussed here.

Figure 6:
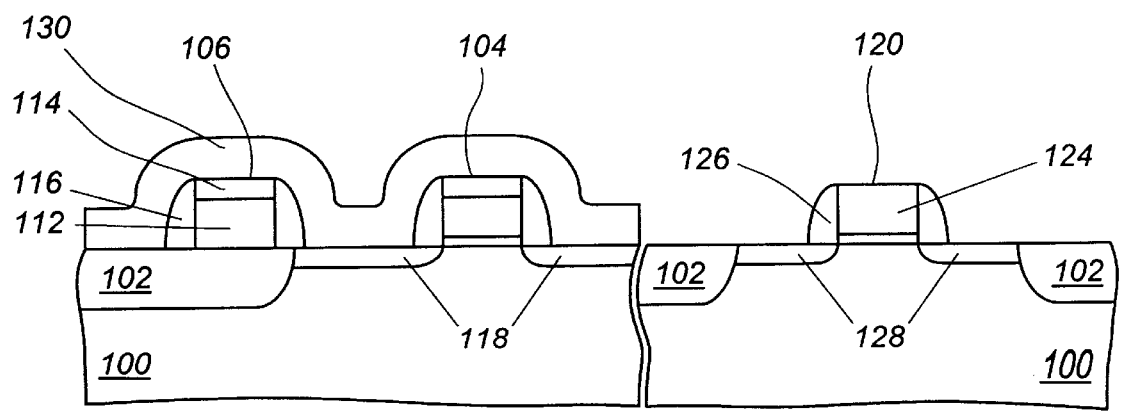
Figure 7:
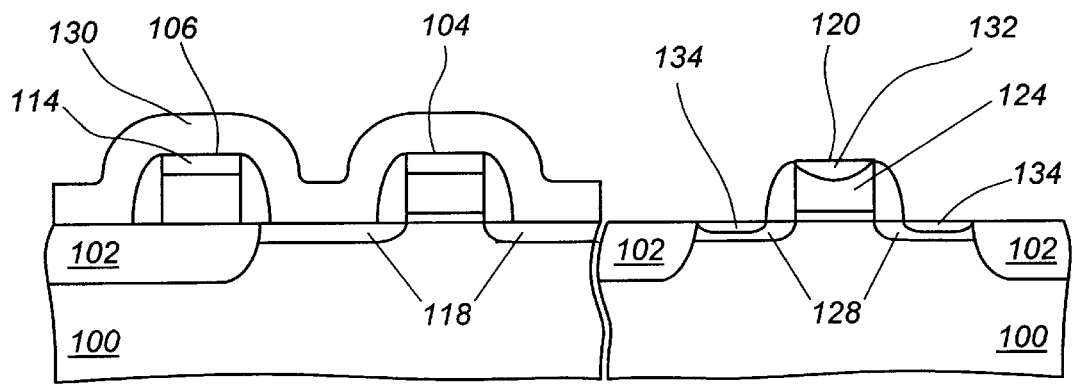

After the transfer FETs 104 of the embedded DRAM array and logic FETs 120 of the logic circuitry have been formed, a salicide process is then performed on the logic FETs to provide silicide layers on the polysilicon electrode 124 and on the source/drain regions 128. To prevent the salicide process from forming a silicide layer on the source/drain regions 118 of the transfer FETs, which could introduce leakage, it is preferable to form a protective layer over the transfer FETs 104 and other parts of the embedded DRAM regions. Referring to FIG. 6, a protective oxide layer 130 is deposited, for example, to a thickness of between about 1000–2000 Å in a CVD process from a TEOS source gas. Protective oxide-layer 130 or a similar insulator that has good compatibility with other processing steps is preferred because oxide will not significantly react with the titanium or other source metal used in the logic FET salicide process. In addition, because layer 130 is an insulator, it need not be completely removed from over the transfer FETs and other parts of the embedded DRAM regions before further processing. The salicide process begins by sputtering a layer of titanium over the surface of the device to a thickness of, for example, 500 Å. This titanium layer is converted into titanium silicide at the surface of the polysilicon gate electrodes 124 of the logic FETs and at the exposed portions of the substrate, including the source/drain regions 128, in a two step annealing process. In the first process step, the device is subjected to a rapid thermal anneal (RTA) by heating the device to a temperature of less than about 700° C. for about thirty seconds. The first RTA step of the process converts the titanium layer into titanium silicide (nominally $TiSi_2$) where the titanium layer is in contact with a silicon (crystalline or polycrystalline) surface during the anneal. In the initial RTA step, a layer of titanium silicide 132 is formed over the polysilicon gate electrode 124 and titanium silicide layers 134 are formed over the source/drain regions 128, as shown in FIG. 7. The first RTA process is followed by an etch to remove unreacted portions of the titanium layer, leaving behind titanium silicide on the exposed silicon of the gate electrodes 124 and source/drain regions 128.

After the initial RTA step, the surface of the device is subjected to a wet etch consisting of $H_2O_2$ and $NH_4OH$ diluted in water to remove unreacted titanium and a variety of undesired titanium compounds from the surface of the device, in the process completely exposing the protective oxide layer 130 over the embedded DRAM regions. After the unreacted titanium is removed from the device, further processing is necessary to provide suitable silicide layers on the gate electrodes and over the source/drain regions. The titanium silicide layers are further processed in a second RTA process to achieve a desired low resistivity phase for the titanium silicide layers. Most of the titanium silicide formed on the silicon surfaces in the first annealing step described above (RTA at about 700° C. for 30 sec.) will be the relatively high resistivity metastable phase (known as the "C-49" phase) of titanium silicide, which does not have as low of resistivity as is desirable. It is accordingly desirable to expose the device to a second annealing step at a temperature in excess of 750° C. for at least ten seconds to convert the higher resistivity C-49 phase of titanium silicide to the lower resistivity orthogonal phase (known as the "C-54" phase) of titanium silicide. By performing the salicide process for the logic FETs of the exemplary embedded DRAM logic circuit before capacitor formation, the relatively brief RTA processes used to form the silicide regions will not affect the capacitor dielectric layer later provided for the charge storage capacitor. This facilitates use of a high dielectric constant material as the capacitor dielectric for the embedded DRAM array.

Figure 8:
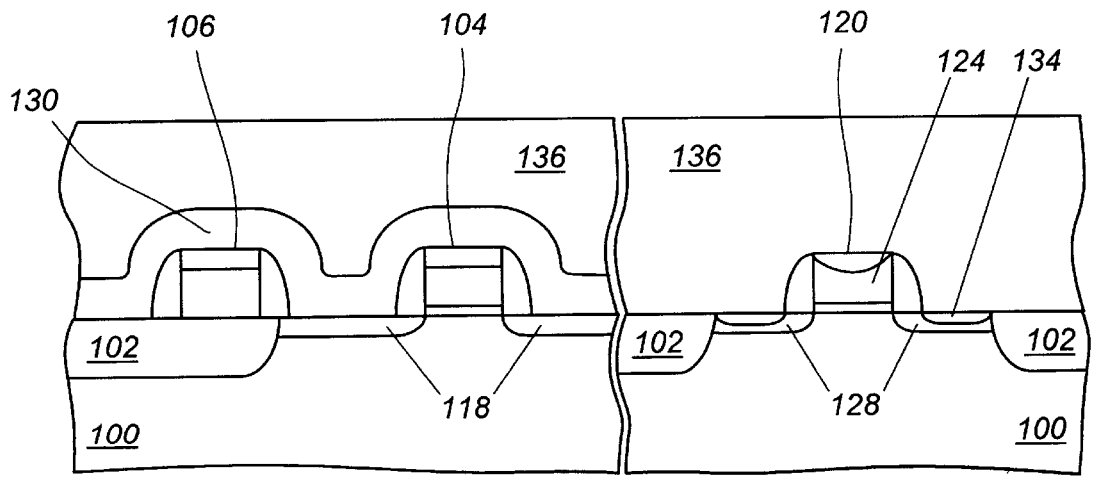

Referring to FIG. 8, an interlayer dielectric layer 136 is next provided over the transfer FETs 104 of the embedded DRAM array and over the logic FETs and other portions of the logic circuitry. Interlayer dielectric 136 is generally similar to the interlayer dielectric used in conventional logic circuitry. For example, the interlayer dielectric might consist of an oxide layer deposited by atmospheric pressure chemical vapor deposition (APCVD) from a TEOS source gas that is subsequently planarized by, for example, chemical mechanical polishing (CMP). The resulting planarized interlayer dielectric 136 is typically sufficiently thick to safely cover the various FETs and other devices of the embedded DRAM and logic circuits formed to this point in the process. There is an advantage to providing a comparatively thick interlayer dielectric 136 in that the thickness of the interlayer dielectric 136 will determine in part the capacitance of the charge storage capacitors. As such, it may be desirable to adjust the thickness of the interlayer dielectric 136 to provide sufficient capacitance for the capacitors of the embedded DRAM design. After providing the planarized dielectric layer, contact vias are formed to expose each of the source/drain regions 118 of the transfer FET 104 of the embedded DRAM array and also to expose appropriate ones of the source/drain regions 128 and gate electrodes 124 of the logic circuits. The contact vias may be formed by providing a photoresist mask in a conventional photolithography process and then etching the contact vias using, for example, a reactive ion etching process with an etchant derived in a plasma process from a source gas including $CF_4$. The photoresist mask is then stripped to provide the structure illustrated in FIG. 9.

Figure 9:
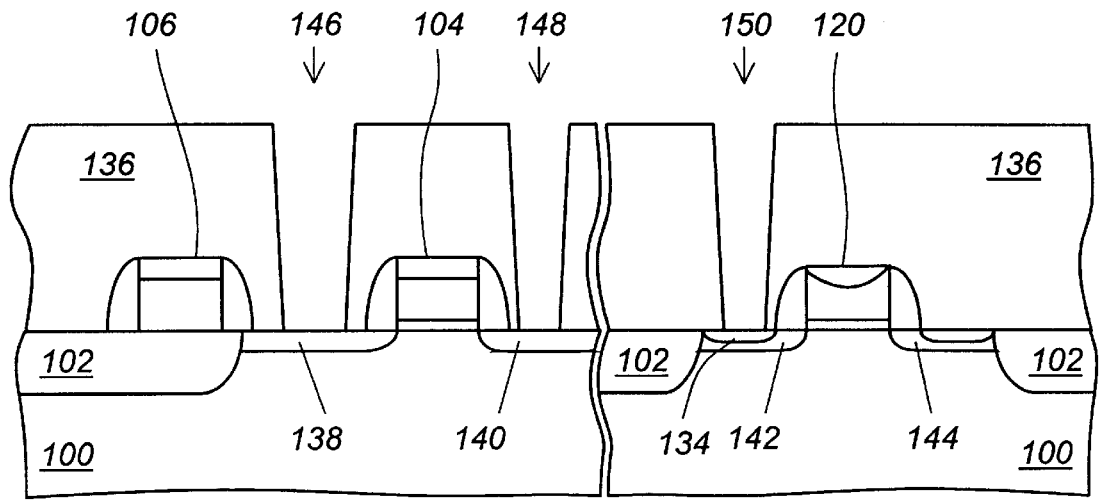
Figure 10:
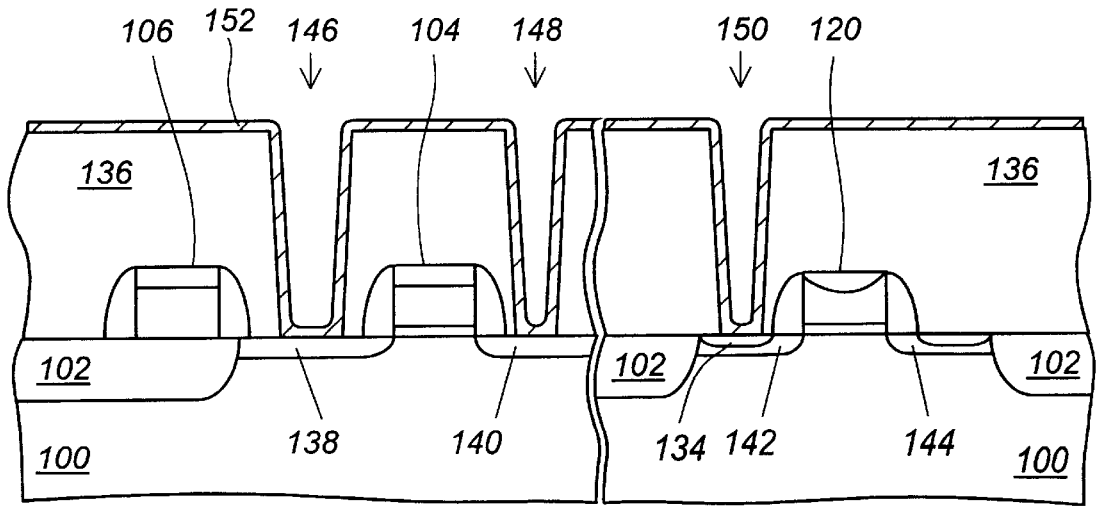

As schematically illustrated in FIG. 9, a contact via 146 is provided exposing a surface of source/drain region 138 of the transfer FET that will serve as the charge storage node for the illustrated embedded DRAM cell. Contact via 148 extends through interlayer dielectric 136 to expose source/drain region 140 which will typically serve as a common bit line contact between two adjacent transfer FETs of two adjacent embedded DRAM cells (only one illustrated). To the extent permissible within the overall design, it is preferable to make the contact via 146 larger than the contact via 148 to facilitate the formation within contact via 146 of the lower electrode, capacitor dielectric and upper electrode that make up the charge storage capacitor. Formation of the charge storage capacitor requires that an additional, albeit thin, capacitor dielectric layer be provided within contact via 146 that will not be left within contact via 148. More importantly, it is preferred that contact via 146 be comparatively wide to provide better layer uniformity and better deposition conditions within the contact via 146 than within the contact via 148 in which the bit line contact is formed. Also shown in FIG. 9 is the contact via 150 exposing the silicide layer 134 on source/drain region 142 of the logic FET. Various connections between portions of the logic circuitry are provided in part through vertical interconnects. One such interconnect will include a tungsten plug formed within contact via 150 and conductively connected to source/drain region 142 of the illustrated logic FET. Although not illustrated, other openings through the interlayer dielectric are typically provided to different conductors of the logic circuitry and vertical interconnects such as tungsten plugs are formed within these contact vias as required by the particular interconnect scheme of the logic circuit. Most preferably, the tungsten plugs which form bit line contacts and vertical interconnects for the logic circuits are formed using some of the same process steps which are used for forming the lower and upper capacitor electrodes within the embedded DRAM array.

Lower capacitor electrodes and interconnect plug barrier layers are next formed in accordance with preferred embodiments of the present invention. Most preferably, the metal selected for the barrier layer is chosen so that it can be used both as the barrier/adhesion layer in the tungsten plug process used to form the logic and bit line interconnects and also as at least part of the lower electrode of the embedded DRAM charge storage capacitor. Titanium, titanium-tungsten, and titanium nitride are all known to provide suitable barrier/adhesion layers for tungsten plug processes of the type preferably used in forming the bit line contacts and interconnects for the logic circuits of the present invention. When the preferred tantalum pentoxide capacitor dielectric is used for the embedded DRAM capacitors, or when a similar high dielectric constant material is used for the capacitor dielectric, it is particularly preferred that titanium nitride (TiN) is used to form at least the upper surface of the lower capacitor electrode. For other capacitor dielectric materials, other conductors might be preferred and other conductors might be used with a tantalum pentoxide capacitor dielectric material in other, presently less preferred embodiments. Most often, the entire lower capacitor electrode is formed from titanium nitride so that a thin layer of titanium nitride, deposited conformally to line the contact via 146, serves as the lower electrode of the charge storage capacitor of the illustrated embedded DRAM cell. Titanium nitride deposited within contact vias 148 and 150 at the same time as it is deposited within contact via 146 will then be used as the barrier layer for the interconnect plugs provided within contact vias 148 and 150. Preferably, a titanium nitride layer 152 (FIG. 10) is deposited to line the contact vias 146, 148, 150 in a low temperature process.

Such a low temperature process is preferred to limit the diffusion of metals from the salicided regions of the logic FETs, thereby limiting degradation of the logic FETs. Accordingly, a titanium nitride layer 152 is preferably deposited over the FIG. 9 structure to a thickness of about 1000 Å or less using a sputtering process and a relatively low substrate temperature or, more preferably, the titanium nitride layer is deposited in a chemical vapor deposition (CVD) process to produce the FIG. 10 structure. Titanium nitride can be deposited by CVD from $TiCl_4+NH_3$ source gases at a desirably low substrate temperature. The CVD process has the particular advantage over sputtering that CVD is much less likely to heat the deposition substrate during the deposition process.

Figure 11:
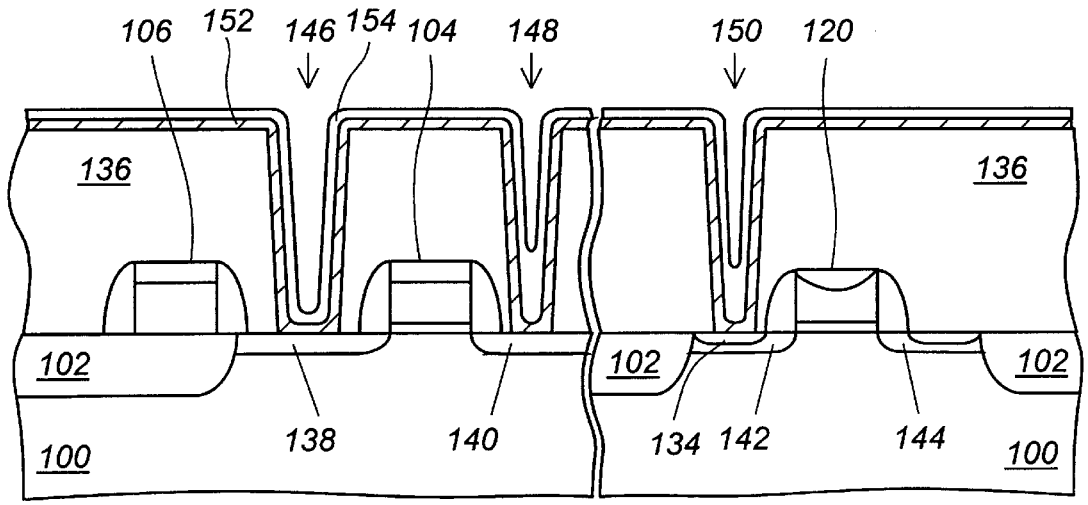
Figure 12:
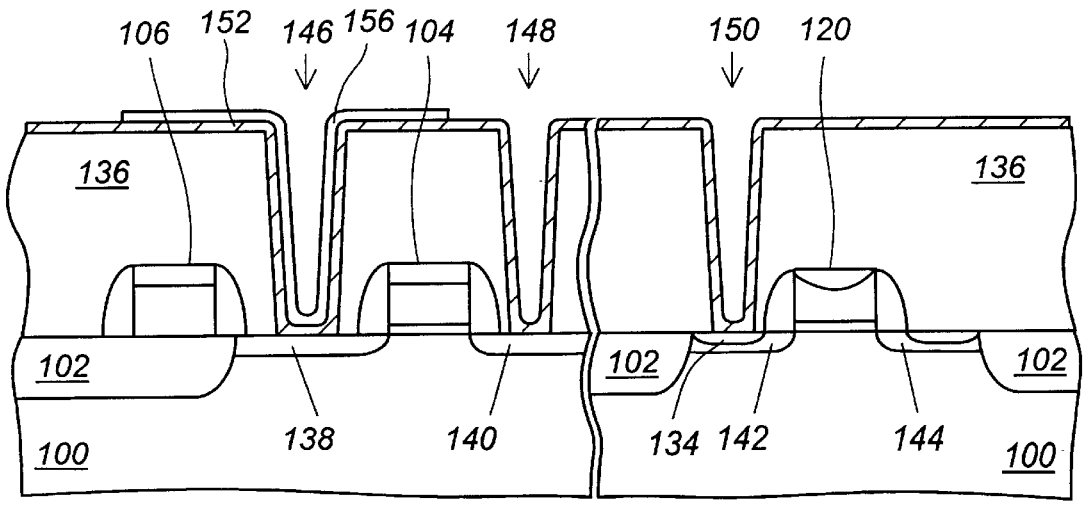

Next, as illustrated in FIG. 11, a layer of capacitor dielectric material 154 is provided over the surface of the deposited metal layer 152. At some point in the process, it will be necessary to pattern titanium nitride layer 152 to define the extent of the different interconnect structures. By patterning the titanium nitride layer later in the process, more particularly by patterning the titanium nitride layer 152 after deposition of the tungsten plug layer, edges of the upper and lower capacitor electrodes. As such, the capacitor dielectric material is deposited over the entire surface of the titanium nitride layer 152, including within those contact vias in which tungsten interconnect plugs are formed. In particularly preferred embodiments of the present invention, a high dielectric constant capacitor dielectric material is preferred for layer 154, such as tantalum pentoxide, barium strontium titanate, lead zirconate titanate, another similar oxide material or another high dielectric constant material. Most preferably, the chosen capacitor dielectric layer 154 has a dielectric constant "k" significantly higher, on the order of about 20–25 or more, than the effective dielectric constant of ONO. Use of a high dielectric constant material as the capacitor dielectric facilitates use of the simple capacitor electrode structure preferred for the embedded DRAM cell without requiring larger design rules than those desirably used to achieve high density in the exemplary device. In the illustrated embodiment, a capacitor dielectric layer 132 of tantalum pentoxide, nominally $Ta_2O_5$, is deposited in a chemical vapor deposition (CVD) process from a source gas mixture consisting of $Ta(OC_2H_5)_5+O_2$. The tantalum pentoxide capacitor dielectric might be deposited in a high density deposition system such as the LAM 9800 Integrity system to a thickness of between about 20–140 Å. The particular thickness chosen for the capacitor dielectric is preferably thin to maximize the resulting capacitance but sufficiently thick to ensure that the capacitor dielectric layer 154 does not have unacceptable pin holes or an unacceptable breakdown voltage.

After the capacitor dielectric layer 154 is deposited over the device, the capacitor dielectric layer is removed from those portions of the device other than where the capacitor dielectric layer is needed for the capacitors of the embedded DRAM array. This may be accomplished by providing a photoresist mask or another type of mask over the portions of the titanium nitride layer 152 that will be formed into the lower capacitor electrodes. This mask exposes the capacitor dielectric layer 154 over the logic circuits and bit line contacts of the embedded DRAM array and then an etch is performed to remove the capacitor dielectric layer from where it is not required. This etch may be one of the conventional dry etch processes or might be a wet etch using, for example, a dilute hydrofluoric acid solution. Under some circumstances, it may be preferred to use a wet etch to ensure that the photoresist mask can be removed as easily as possible using a solvent clean without resort to an ashing or other oxygen based photoresist stripping process. This can be advantageous when layer 154 is a high dielectric constant material such as tantalum pentoxide because such materials can be sensitive to processing steps in an oxygen environment. The particular mask used in removing the capacitor dielectric layer 154 from portions of the FIG. 11 device is not, in the illustrated embodiment, a critical dimension mask. Further processing will be performed to laterally define the capacitor dielectric layer 156 shown in FIG. 12 at a later stage in processing. The capacitor dielectric layer etching mask is then removed.

A layer of metal is then deposited that will serve as an interconnect plug for the bit line contacts and interconnects of the logic circuit and as the upper capacitor electrodes of the charge storage capacitors of the embedded DRAM array. Tungsten is a particularly preferred metal for the interconnect plugs and so is desirably also used as the material for the upper capacitor electrodes. Accordingly, a layer of tungsten is deposited over the surface of the FIG. 12 device, preferably using a CVD process from a $WF_6$ source gas to deposit a sufficient thickness of tungsten to fill the openings within the various contact vias of the FIG. 12 device. Here again, the CVD process is preferred because of its better compatibility with low temperature processing. Most preferably, a sufficient thickness of tungsten, for example, approximately 1000–2500 Å, is deposited over the surface of the FIG. 12 device so that the tungsten layer can be patterned into first level metal interconnects for the logic circuits and bit lines. The tungsten layer is then patterned using conventional photolithography to laterally define an upper capacitor electrode 158 and a bit line contact 160 for the illustrated embedded DRAM cell. It is presently preferred that the bit line contact 160 connect a plurality of other bit line contacts through a tungsten wiring line that extends perpendicularly to the cross-section of the embedded DRAM cell illustrated in FIG. 13. The conventional photolithography step used to pattern the upper capacitor electrode and bit line contact preferably is also used to define interconnect plugs 162 for the logic circuits. To the extent dictated by the particular interconnect scheme of the logic circuits, it may also be desirable to provide a number of wiring line interconnections using the same level of tungsten wiring line on the surface of interlayer dielectric 136. The etching process used to define the tungsten electrodes, interconnects and wiring lines is typically a dry etching process using an etchant derived in a plasma process from a source gas mixture including $Cl_2$ or HCl. To complete definition of the lower capacitor electrode, it may be necessary to alter the etchant composition when the etching process has etched through the layer of tungsten to define the upper capacitor electrode 158. The etchant might need to be adjusted to a fluorine based etching chemistry to remove the capacitor dielectric layer 156 to ensure uniformity of the rest of the etching process across the bit line contact and logic circuit portions of the integrated circuit device. In other circumstances, the etchant used for the tungsten layer may sufficiently remove the very thin capacitor dielectric layer without adjusting the composition of the etchant. Regardless of how the capacitor dielectric layer is patterned, the etching process then continues through the titanium nitride layer 152 using an etchant of similar composition to that used to etch through the tungsten layer. The titanium nitride etching process continues to clear the titanium nitride layer from the surface of interlayer dielectric 136, thereby defining the lateral extent of the lower capacitor electrode 166 and separating the various barrier layers 168 of the interconnect plugs.

Figure 14:
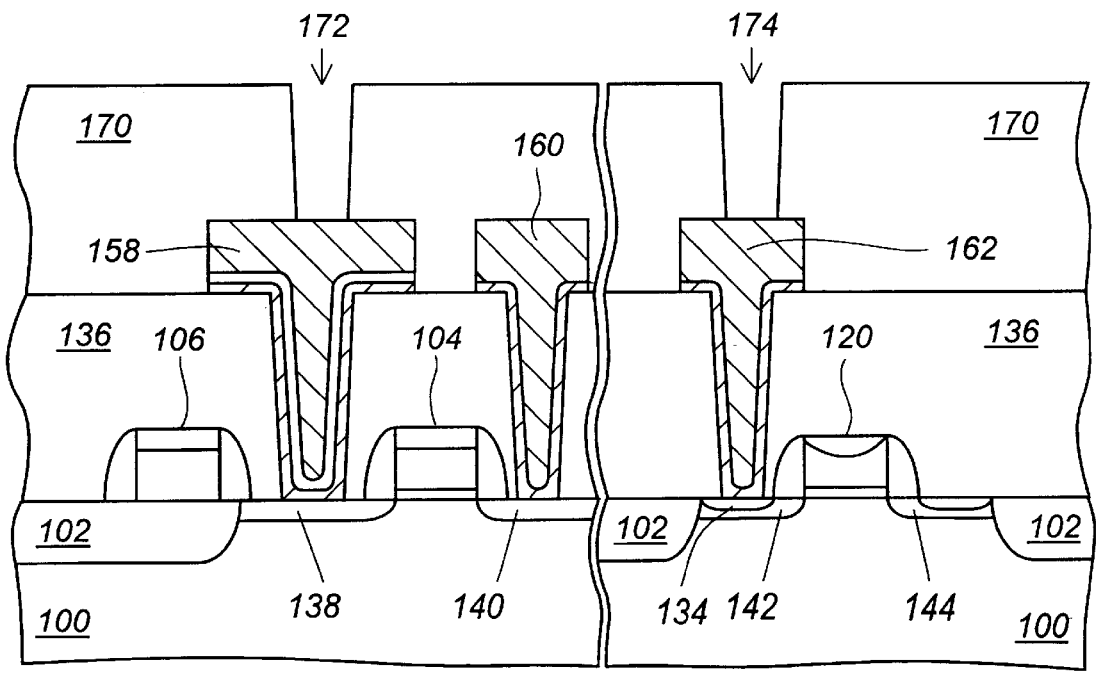

Further processing continues in a manner similar to that used for providing upper level interconnects for conventional logic circuitry. Thus, an intermetal dielectric layer 170 is provided over the upper capacitor electrodes 158 and other portions of the embedded DRAM array and over the logic circuitry. The intermetal dielectric is typically silicon oxide provided in a CVD process from a TEOS source gas, a silicate glass, other dielectric materials, or combinations of dielectric materials. Interlayer dielectric 170 is preferably planarized using CMP. Conventional photolithography and conventional etching processes are performed to provide second level contact vias 172 through the intermetal dielectric 170 to expose the upper capacitor electrodes 158. Second level contact vias 174 are also provided to expose appropriate ones of tungsten interconnect plugs 162 or other conductors of the logic circuits, as required by the interconnect scheme of the logic circuits. The resulting structure is illustrated in FIG. 14.

Figure 15:
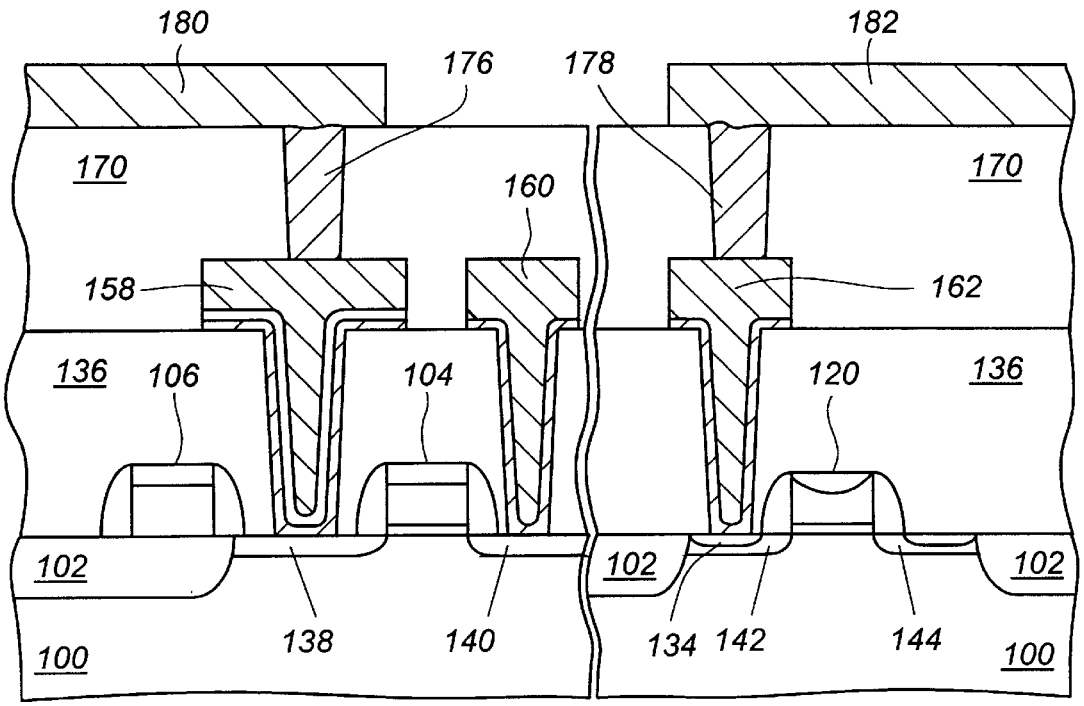

Tungsten is then deposited, again in a CVD process, over the planarized surface of the intermetal dielectric 170 to fill the contact vias 172, 174. An etch back process is used to remove unwanted portions of the tungsten layer from the interlayer dielectric 170 so as to define vertical interconnects 176 electrically connected to the upper capacitor electrodes 158 and interconnects 178 connected to appropriate conductors within the logic circuitry. The etch back process may, for example, be a reactive ion etching process using an etchant derived from a source gas mixture including $SF_6$. For the illustrated embodiment, the next level of wiring is provided by depositing a layer of aluminum or an alloy of aluminum with copper over the surface of the intermetal dielectric and then patterning the aluminum layer using conventional lithography to define wiring lines extending over the intermetal dielectric layer 170 and electrically connected to interconnect plugs 176 and 178. Most preferably, the wiring line 180 connected through interconnect plug 176 to upper capacitor electrode 158 is connected to the ½ $V_{cc}$ reference potential generally used as the reference voltage for DRAM capacitors. Wiring line 182, which is on the same level and extends across the same surface of intermetal dielectric 170 as the ½ $V_{cc}$ line 180, provides additional further interconnections between portions of the logic circuitry. This device is illustrated in FIG. 15. Further processing continues in the conventional manner to complete fabrication of the FIG. 15 device, thereby providing an embedded DRAM array within a logic circuit in a highly manufacturable manner.

Figure 13:
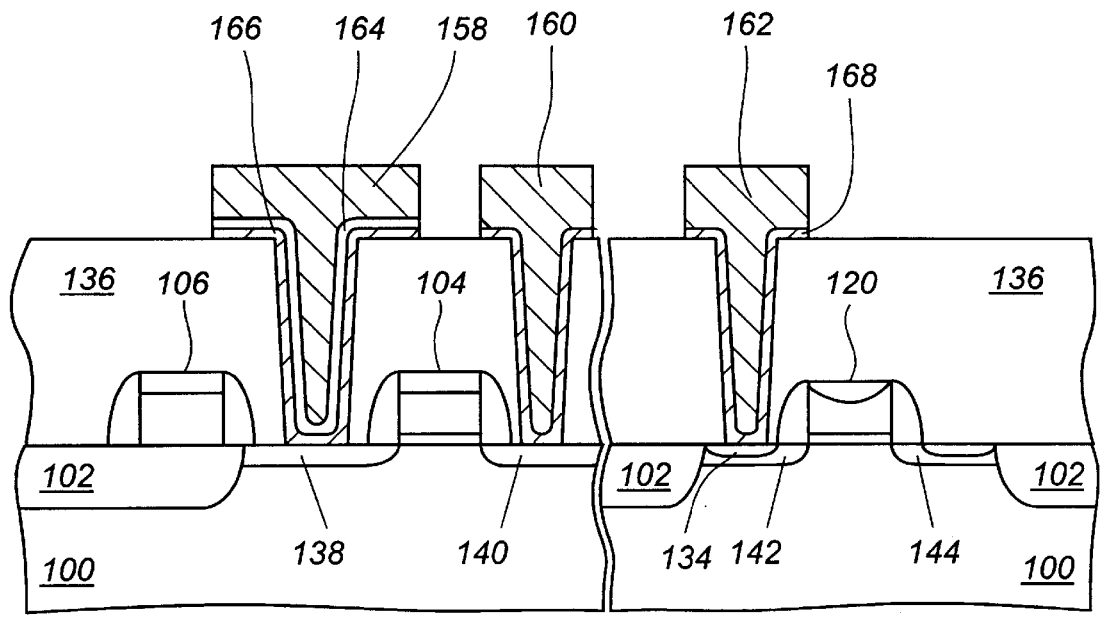
Figure 16:
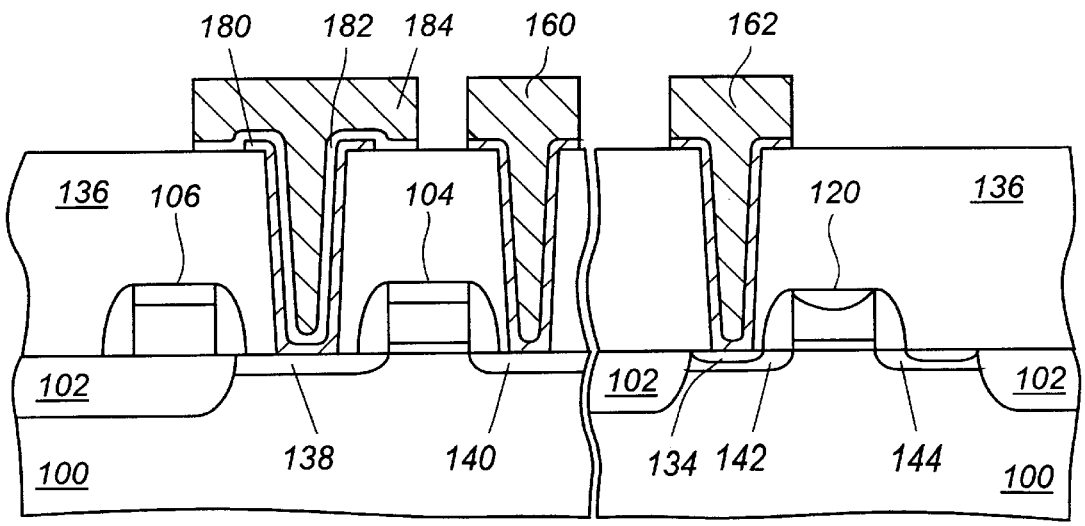
FIG. 16 illustrates an alternate configuration of a capacitor particularly preferred for an embedded DRAM cell.

FIG. 16 shows a variation on an embedded DRAM capacitor that has improved sidewall leakage characteristics as compared to the capacitor illustrated in FIG. 13. In this embodiment, the titanium nitride lower electrode 180 is laterally defined prior to deposition of the capacitor dielectric material 182. The extent of the lower capacitor electrode 180 is such that the upper capacitor electrode 184 will extend beyond the edges of the lower capacitor electrode in all directions. After the lower capacitor electrode 180 is laterally defined, the capacitor dielectric is deposited over the surface of the device and further processing is performed like that discussed above as following the step illustrated in FIG. 12 to complete the illustrated capacitor. The result is a charge storage capacitor having a lower electrode 180 whose edges are covered by capacitor dielectric layer 182. Tungsten upper capacitor electrode 184 extends beyond the edges of the lower capacitor electrode as illustrated. In addition to the advantages of reduced sidewall leakage, the FIG. 16 embodiment has the further advantage of not requiring that the tungsten etching process used to define plugs 160 and 162 and upper capacitor electrode 184 etch through the capacitor dielectric layer. Thus, even if the etchant used for laterally defining the upper capacitor electrode 184 does not acceptably etch the material chosen for the capacitor dielectric layer 182, the etching process need not be altered in the course of etching the tungsten layer for the FIG. 16 embodiment.

While the present invention has been described in terms of certain preferred embodiments, those of ordinary skill in the art will appreciate that various modifications and alterations of the methods and structures described herein can be made while not varying from the teachings of the present invention. Accordingly, the present invention is not to be limited to any particular embodiment described herein but the scope of the present invention is instead to be determined from the claims which follow.

What is claimed:

1. A method of making an integrated circuit device including both embedded DRAM circuits and logic circuits on a single substrate, the method comprising the steps of:
   providing a substrate and providing transfer FETs in and on embedded DRAM circuit regions of the substrate, the transfer FETs having first and second source/drain regions and gate electrodes;
   providing on the substrate logic FETs in and on logic circuit regions of the substrate, the logic FETs having source/drain regions and gate electrodes;
   providing a first insulating layer over the transfer FETs and over the logic FETs, the first insulating layer having a surface;
   defining first and second openings through the first insulating layer to expose the first and second source drain regions, respectively, of at least one of the transfer FETs and defining a third opening to expose at least one conductor within the logic circuit;
   providing a first conductive layer over the first insulating layer and extending into the openings to contact the first source/drain region of the one transfer FET, the first conductive layer lining and not filling the first opening;
   providing a capacitor dielectric layer within the first opening;
   providing a second conductive layer within the first opening; and
   patterning the first conductive layer and the second conductive layer to laterally define a lower and an upper capacitor electrode, respectively, of an embedded DRAM charge storage capacitor.

2. The method of claim 1, wherein the embedded DRAM charge storage capacitor is formed without use of high temperature processing steps.

3. The method of claim 2, wherein the embedded DRAM charge storage capacitor is formed at temperatures below about 700° C.

4. The method of claim 3, wherein the capacitor dielectric layer is a high dielectric constant material.

5. The method of claim 1, wherein silicide layers are provided on the source/drain regions of the logic FETs and wherein the capacitor dielectric layer is provided after the silicide layers are provided.

6. The method of claim 5, wherein the first insulating layer is formed by depositing insulating material over the protective dielectric layer.

7. The method of claim 1, further comprising the steps of:
   selectively covering the transfer FETs with a protective dielectric layer while leaving the logic FETs exposed;
   depositing a metal layer over the logic FETs and annealing the metal layer to react the metal layer with portions of the logic FETs;
   removing portions of the metal layer after the step of annealing the metal layer; and
   forming the first insulating layer.

8. The method of claim 1, wherein the first insulating layer is formed by deposition and is planarized before the first and second openings are formed.

9. The method of claim 8, wherein the first insulating layer is planarized using chemical mechanical polishing.

10. The method of claim 1, wherein the first conductive layer is provided within the second and the third openings so that the first conductive layer is in contact with the second source/drain region within the second opening and the first conductive layer is in contact with the at least one conductor within the third opening.

11. The method of claim 10, further comprising the step of removing the capacitor dielectric layer from within the second opening and the third opening.

12. The method of claim 10, wherein the second conductive layer is provided within the second opening and the third opening so that the second conductive layer is in contact with the first conductive layer within the second opening and within the third opening.

13. The method of claim 12, wherein the second conductive layer comprises tungsten.

14. The method of claim 10, wherein the first conductive layer comprises titanium or tungsten.

15. The method of claim 14, wherein the first conductive layer comprises titanium nitride.

16. The method of claim 15, wherein the capacitor dielectric layer is tantalum pentoxide.

17. The method of claim 14, wherein the capacitor dielectric layer is a high dielectric constant material.

18. The method of claim 14, wherein the capacitor dielectric layer comprises an oxide of tantalum.

19. The method of claim 1, wherein the first conductive layer is provided within the third opening so that the first conductive layer is in contact with the at least one conductor within the third opening.

20. The method of claim 19, further comprising the step of removing the capacitor dielectric layer from within the third opening.

21. The method of claim 20, wherein the second conductive layer is provided within the third opening so that the second conductive layer is in contact with the first conductive layer within the third opening.

22. The method of claim 21, wherein the first conductive layer comprises titanium or tungsten.

23. The method of claim 22, wherein the first conductive layer comprises titanium nitride.

24. The method of claim 22, wherein the capacitor dielectric layer is a high dielectric constant material.

25. The method of claim 24, wherein the capacitor dielectric layer is tantalum pentoxide.

26. The method of claim 25, wherein the second conductive layer comprises tungsten.

27. The method of claim 21, wherein the capacitor dielectric layer comprises an oxide of tantalum.

28. The method of claim 21, further comprising the steps of:

depositing a second insulating layer over the second conductive layer;

providing a fourth opening through the second insulating layer to expose the upper capacitor electrode;

providing a fifth opening through the second insulating layer to expose a portion of the second conductive layer connected to the at least one conductor;

depositing a third conductive layer within the fourth and fifth openings and over the second insulating layer; and patterning the third conductive layer to form a wiring line connecting the upper capacitor electrode to a reference potential through the fourth opening and to form a logic wiring line connected to the at least one conductor.

29. The method of claim 28, wherein the reference potential is ½ $V_{cc}$.

30. The method of claim 28, wherein the third conductive layer comprises aluminum.

31. The method of claim 1, wherein edges of the upper capacitor electrode are laterally aligned with edges of the lower capacitor electrode.

32. The method of claim 31, wherein the upper capacitor electrode and the lower capacitor electrode are laterally defined in an anisotropic dry etching step.

33. The method of claim 31, wherein the step of patterning also patterns a portion of the capacitor dielectric layer.

34. The method of claim 1, wherein the first conductive layer is patterned before the capacitor dielectric layer is provided.

35. The method of claim 34, wherein the capacitor dielectric layer comprises an oxide of tantalum.

36. The method of claim 34, wherein the second conductive layer comprises tungsten.

37. The method of claim 34, wherein edges of the lower capacitor electrode are covered by the capacitor electric layer.

38. The method of claim 37, wherein edges of the upper capacitor electrode extend laterally beyond the edges of the lower capacitor electrode.

39. The method of claim 38, wherein the first conductive layer comprises titanium or tungsten.

40. The method of claim 38, wherein the first conductive layer comprises titanium nitride.

41. The method of claim 38, wherein the capacitor dielectric layer is a high dielectric constant material.

42. The method of claim 38, wherein the capacitor dielectric layer is tantalum pentoxide.

43. The method of claim 1, further comprising the steps of:

depositing a second insulating layer over the second conductive layer;

providing a fourth opening through the second insulating layer to expose the upper capacitor electrode;

forming a conductor within the fourth opening; and connecting the upper capacitor electrode to a reference potential through the fourth opening.

44. The method of claim 43, wherein the reference potential is ½ $V_{cc}$.

* * * * *